United States Patent
Yu et al.

(10) Patent No.: US 11,539,823 B2
(45) Date of Patent: Dec. 27, 2022

(54) DEVICE AND METHOD FOR MUFFLING, COMMUNICATION DEVICE AND WEARABLE DEVICE

(71) Applicants: BOE TECHNOLOGY GROUP CO., LTD., Beijing (CN); Fuzhou BOE Optoelectronics Technology Co., Ltd., Fujian (CN)

(72) Inventors: Yang Yu, Beijing (CN); Jiamin Liao, Beijing (CN); Shijian Luo, Beijing (CN); Tao Luo, Beijing (CN); Heyuan Qiu, Beijing (CN); Xiaowei Liu, Beijing (CN); Haiguang Li, Beijing (CN); Fan Chen, Beijing (CN)

(73) Assignees: BEIJING BOE TECHNOLOGY DEVELOPMENT CO., LTD., Beijing (CN); FUZHOU BOE OPTOELECTRONICS TECHNOLOGY CO., LTD., Fujian (CN)

( * ) Notice: Subject to any disclaimer, the term of this patent is extended or adjusted under 35 U.S.C. 154(b) by 1137 days.

(21) Appl. No.: 16/133,413

(22) Filed: Sep. 17, 2018

(65) Prior Publication Data
US 2019/0253545 A1    Aug. 15, 2019

(30) Foreign Application Priority Data
Feb. 11, 2018  (CN) ......................... 201810142741.1

(51) Int. Cl.
G10L 17/04    (2013.01)
H04M 1/19    (2006.01)
(Continued)

(52) U.S. Cl.
CPC ............. *H04M 1/19* (2013.01); *G10L 15/063* (2013.01); *G10L 17/04* (2013.01); *H03G 1/02* (2013.01)

(58) Field of Classification Search
CPC ........ H04M 1/19; G10L 15/063; G10L 17/04; H03G 1/02
(Continued)

(56) References Cited

U.S. PATENT DOCUMENTS

2002/0077838 A1\* 6/2002 Dutta .................... G06Q 30/02
381/73.1
2017/0149943 A1\* 5/2017 Moser .............. G10K 11/17861

FOREIGN PATENT DOCUMENTS

CN    104036782 A    9/2014
CN    204090090 U    1/2015
(Continued)

OTHER PUBLICATIONS

"IEEE Guide for Power-Station Noise Control," in IEEE Std 640-1985, vol. no., pp. 0_1-, 1985, doi: 10.1109/IEEESTD.1985. 81069. (Year: 1985).\*
(Continued)

*Primary Examiner* — Bharatkumar S Shah
(74) *Attorney, Agent, or Firm* — Xsensus LLP

(57) ABSTRACT

A muffling device includes an acquisition circuit, configured to obtain reference sound wave information of a user. The muffling device includes a modulation circuit, configured to analyze an acoustic wave characteristic of the reference sound wave information to obtain a characteristic parameter of the reference sound wave information. The muffling device includes a muffling circuit, configured to generate compensated sound wave information according to the characteristic parameter of the reference sound wave information. The muffling device includes a correction circuit,
(Continued)

configured to compare muffed sound wave information superimposed by the compensated sound wave information and the reference sound wave information with the reference sound wave information, and feed back a comparison result to the muffling circuit. The muffling circuit can adjust the compensated sound wave information according to a fed back comparison result. The muffling device includes an output circuit, configured to output adjusted compensated sound wave information.

17 Claims, 4 Drawing Sheets

(51) Int. Cl.
　　*G10L 15/06*　　(2013.01)
　　*H03G 1/02*　　(2006.01)
(58) Field of Classification Search
　　USPC .......................................... 181/242
　　See application file for complete search history.

(56) References Cited

FOREIGN PATENT DOCUMENTS

| | | | |
|---|---|---|---|
| CN | 105635493 A | 6/2016 | |
| CN | 105657150 A | 6/2016 | |
| CN | 107071119 A | 8/2017 | |
| CN | 107483670 A | 12/2017 | |
| JP | 1997251935 A * | 9/1997 | ........... G10K 11/178 |
| WO | WO-2012/119808 A2 | 9/2012 | |

OTHER PUBLICATIONS

Z. Falin, L. Dehua and Z. Yuping, "Effects of Higher Order Mode Waves on Muffler Performance," 2010 International Conference on Optoelectronics and Image Processing, 2010, pp. 468-472, doi: 10.1109/ICOIP.2010.70. (Year: 2010).*

Chinese Office Action dated Sep. 3, 2019, from application No. 201810142741.1.

Chinese Office Action dated Apr. 16, 2020, from application No. 201810142741.1.

* cited by examiner

DEVICE AND METHOD FOR MUFFLING, COMMUNICATION DEVICE AND WEARABLE DEVICE

CROSS REFERENCE

The present application is based upon and claims priority to Chinese Patent Application No. 201810142741.1, filed on Feb. 11, 2018, and the entire contents thereof are incorporated herein by reference.

TECHNICAL FIELD

The present disclosure relates to the field of communication technology, in particular, to a device and a method for muffling, a communication device and a wearable device.

BACKGROUND

With the development of society, people pay more and more attention to information confidentiality. However, in the process of telephone communication, personal privacy or company secrets are often inadvertently leaked, and the people nearby may be disturbed if the volume of the call is too large.

Based on the problem of excessive volume of the call, the traditional practice is mainly to weaken the sound from the two aspects of the sound source and the sound transmission path, such as leaving the crowd to the unmanned area for communication, or actively suppressing the sound, etc.

On one hand, in the case where the image capturing device is held onto the frame of the display device, it is possible to damage the frame of the display device. On the other hand, in the case where the image capturing device is disposed beside the display device, it will occupy extra space.

It should be noted that, information disclosed in the above background portion is provided only for better understanding of the background of the present disclosure, and thus it may contain information that does not form the prior art known by those ordinary skilled in the art.

SUMMARY

The present disclosure provides a device and a method for muffling, a communication device and a wearable device.

Other features and advantages of the present disclosure will be apparent from the following detailed description, or in part, may be learned by implementing the present disclosure.

According to one aspect, the present disclosure provides a device for muffling. The device includes
  an acquisition circuit configured to obtain reference sound wave information of a user.
  The device includes a modulation circuit, configured to analyze an acoustic wave characteristic of the reference sound wave information to obtain a characteristic parameter of the reference sound wave information.
  The device includes a muffling circuit, configured to generate compensated sound wave information according to the characteristic parameter of the reference sound wave information. A characteristic parameter of the compensated sound wave information and the characteristic parameter of the reference sound wave information are complementary to each other.
  The device includes a correction circuit, configured to compare muffed sound wave information superimposed by the compensated sound wave information and the reference sound wave information with the reference sound wave information, and feed back a comparison result to the muffling circuit. The muffling circuit is further configured to adjust the compensated sound wave information according to a fed back comparison result.
  The device includes an output circuit, configured to output adjusted compensated sound wave information.

In an exemplary arrangement of the present disclosure, the characteristic parameters includes a phase, an amplitude, and a frequency.

In an exemplary arrangement of the present disclosure, the correction circuit includes
  a monitoring unit, configured to compare the muffed sound wave information with the reference sound wave information and monitor in real time whether an amplitude of the muffed sound wave information exceeds a threshold amplitude. The correction circuit includes
  a correcting unit, configured to feed back a comparison result to the muffling circuit and transmit a correction command when the amplitude of the muffed sound wave information exceeds the threshold amplitude.

In an exemplary arrangement of the present disclosure, the muffling device further includes a voice library. The voice library includes
  a collecting unit, configured to input at least one of sound wave information and text information of the user. The voice library includes
  a storage unit, configured to generate a user's voice library according to at least one of recorded sound wave information and text information. The voice library includes
  a learning unit, configured to optimize the user's voice library according to at least one of the recorded sound wave information and the text information.

In an exemplary arrangement of the present disclosure, the acquisition circuit includes
  an acquisition unit, configured to acquire original sound wave information including sound wave information of the user. The acquisition circuit includes
  an identification unit, configured to identify the original sound wave information according to a standard sound wave information of the user stored in the voice library to obtain interference sound wave information in the original sound wave information and the reference sound wave information. The interference sound wave information is different from a voiceprint feature of the standard sound wave information. The reference sound wave information that is the same as the voiceprint feature of the standard sound wave information. The acquisition circuit includes
  a filtering unit, configured to filter the original sound wave information to eliminate the interference sound wave information and retain the reference sound wave information.

According to an aspect, the present disclosure provides a muffling method. The method includes.
  obtaining reference sound wave information of a user.
  The method includes analyzing an acoustic wave characteristic of the reference sound wave information to obtain a characteristic parameter of the reference sound wave information.
  The method includes generating compensated sound wave information according to the characteristic parameter of the reference sound wave information. A characteristic parameter of the compensated sound wave information and the characteristic parameter of the reference sound wave information are complementary.

The method includes comparing muffed sound wave information superimposed by the compensated sound wave information and the reference sound wave information with the reference sound wave information, and feeding back a comparison result.

The method includes adjusting the compensated sound wave information according to a fed back comparison result.

The method includes outputting adjusted compensated sound wave information.

In an exemplary arrangement of the present disclosure, the characteristic parameters includes a phase, an amplitude, and a frequency.

In an exemplary arrangement of the present disclosure, comparing muffed sound wave information superimposed by the compensated sound wave information and the reference sound wave information with the reference sound wave information, and feeding back a comparison result to the muffling circuit includes
- comparing the muffed sound wave information with the reference sound wave information and monitor in real time whether an amplitude of the muffed sound wave information exceeds a threshold amplitude. Comparing muffed sound wave information superimposed by the compensated sound wave information and the reference sound wave information with the reference sound wave information, and feeding back a comparison result to the muffling circuit includes feeding back a comparison result and transmitting a correction command when the amplitude of the muffed sound wave information exceeds the threshold amplitude.

In an exemplary arrangement of the present disclosure, the muffling method further includes
- inputting at least one of sound wave information and text information of the user. The muffling method includes
- generating a user's voice library according to at least one of recorded sound wave information and text information.
- The muffling method includes optimizing the user's voice library according to at least one of the recorded sound wave information and the text information.
- The sound wave information and the text information include the idiom of the user and the confidential information imported by the user.

In an exemplary arrangement of the present disclosure, obtaining reference sound wave information of a user includes
- acquiring original sound wave information including sound wave information of the user. Obtaining reference sound wave information of a user includes
- identifying the original sound wave information according to a standard sound wave information of the user stored in the voice library to obtain interference sound wave information in the original sound wave information that is different from a voiceprint feature of the standard sound wave information, and the reference sound wave information that is the same as the voiceprint feature of the standard sound wave information. Obtaining reference sound wave information of a user includes filtering the original sound wave information to eliminate the interference sound wave information and retain the reference sound wave information.

According to an aspect, the present disclosure provides a communication device including the above muffling device and a voice communication device, wherein the voice communication device is connected to the acquisition circuit of the muffling device.

According to an aspect, the present disclosure provides a wearable device including the above muffling device.

According to an aspect, the present disclosure provides a muffling device including
- a processor and
- a memory stored with computer readable instructions that, when executed, cause the processor to be configured to perform the muffling method as described above.

In an exemplary arrangement of the present disclosure, the characteristic parameters includes a phase, an amplitude, and a frequency.

In an exemplary arrangement of the present disclosure, comparing muffed sound wave information superimposed by the compensated sound wave information and the reference sound wave information with the reference sound wave information, and feeding back a comparison result to the muffling circuit includes
- comparing the muffed sound wave information with the reference sound wave information and monitor in real time whether an amplitude of the muffed sound wave information exceeds a threshold amplitude, and
- feeding back a comparison result and transmitting a correction command when the amplitude of the muffed sound wave information exceeds the threshold amplitude.

In an exemplary arrangement of the present disclosure, the processor is further configured to
- input at least one of sound wave information and text information of the user. The processor is further configured to
- generate a user's voice library according to at least one of recorded sound wave information and text information.
- The processor is further configured to optimize the user's voice library according to at least one of the recorded sound wave information and the text information.
- The sound wave information and the text information include the idiom of the user and the confidential information imported by the user.

In an exemplary arrangement of the present disclosure, obtaining reference sound wave information of a user includes
- acquiring original sound wave information including sound wave information of the user. Obtaining reference sound wave information of a user includes
- identifying the original sound wave information according to a standard sound wave information of the user stored in the voice library to obtain interference sound wave information in the original sound wave information that is different from a voiceprint feature of the standard sound wave information, and the reference sound wave information that is the same as the voiceprint feature of the standard sound wave information. Obtaining reference sound wave information of a user includes
- filtering the original sound wave information to eliminate the interference sound wave information and retain the reference sound wave information.

It is to be understood that both the foregoing general description and the following detailed description are exemplary and explanatory only and are not restrictive of the present disclosure, as claimed.

BRIEF DESCRIPTION OF THE DRAWINGS

The accompanying drawings are enclosed to provide a further understanding of the present disclosure and constitute a part of the specification, and together with the following detailed description, to serve for explanation of the present disclosure. It will be apparent that the drawings in the following description refer only to some arrangements of the present disclosure, and other drawings are available to those of ordinary skill in the art without creative labor according to these drawings.

DETAILED DESCRIPTION

Figure 1:
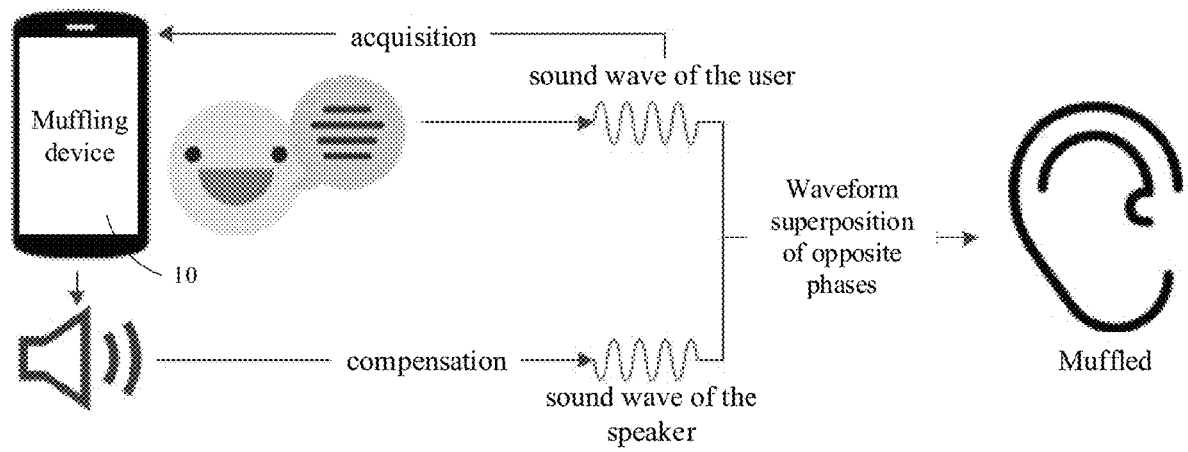
FIG. 1 is a schematic diagram showing an application scenario of a muffling device in an exemplary arrangement of the present disclosure.

Example arrangements will now be described more fully with reference to the accompanying drawings. However, the example arrangements can be embodied in a variety of forms and should not be construed as being limited to the examples set forth herein; rather, these arrangements are provided so that this disclosure will be more fully and complete, and will convey the concept of the present disclosure fully to those skilled in the art. The described features, structures, or characteristics may be combined in any suitable manner in one or more arrangements.

In addition, the drawings are merely schematic representations of the present disclosure and are not necessarily drawn to scale. The same reference numerals in the drawings denote the same or similar parts, and the repeated description thereof will be omitted. Some of the block diagrams shown in the figures are functional entities and do not necessarily have to correspond to physically or logically separate entities. These functional entities may be implemented in software, or implemented in one or more hardware modules or integrated circuits, or implemented in different network and/or processor devices and/or microcontroller devices.

The present exemplary arrangement provides a muffling device, as shown in FIG. 1, the muffling device can be applied to any communication device or wearable device. The muffling device 10 can effectively reduce or even eliminate the volume of the call that is spread to the external environment during a voice call.

Specifically, when the user makes a sound (for example, speaking), the muffling device 10 collects a sound waveform of the user and emits a sound wave having an opposite phase to the waveform of the user through, for example, a speaker. In this case, the sound emitted by the user and the sound of the opposite phase emitted by the muffling device 10 are superimposed on each other, so that the people in the surrounding environment cannot hear the sound of the user, thus achieving the effect of muffling.

Figure 2:
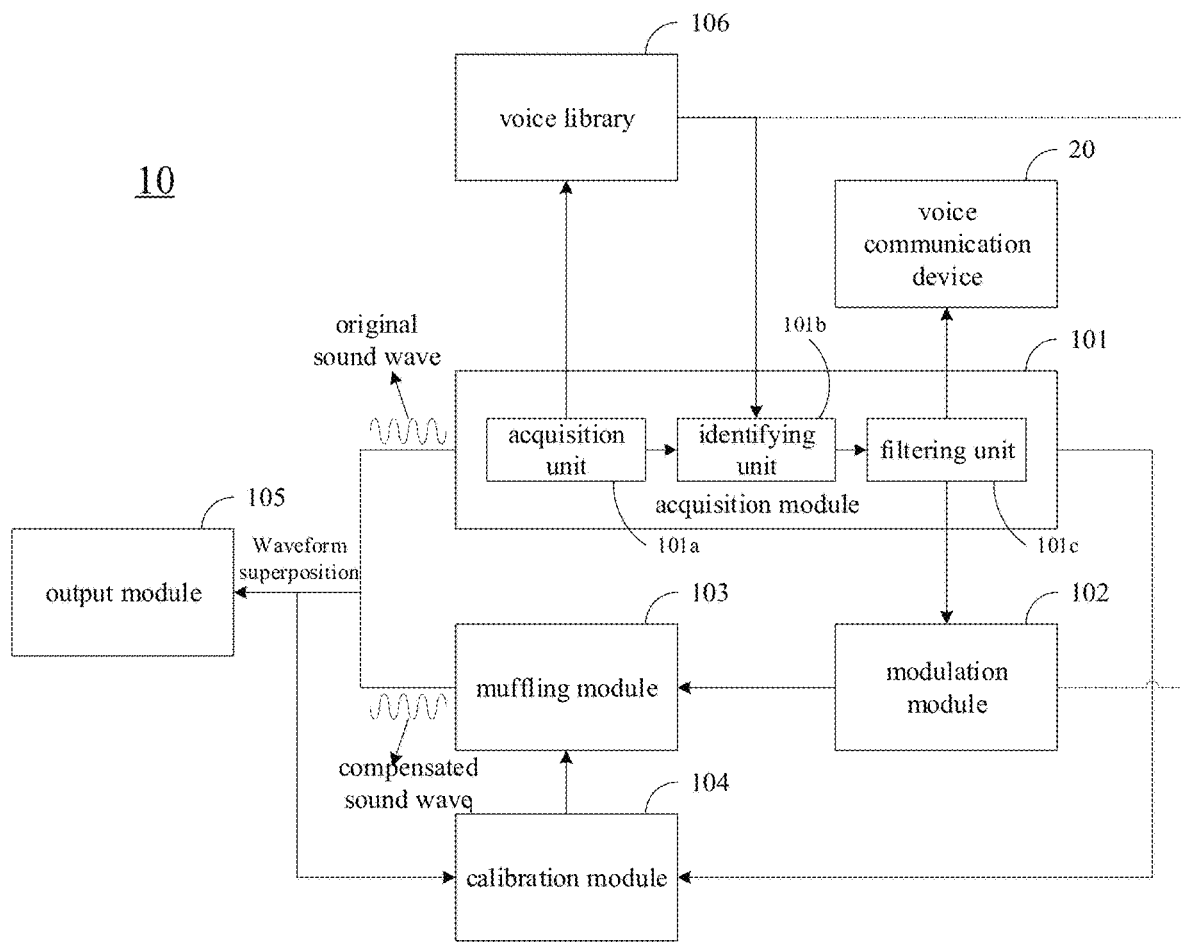
FIG. 2 is a schematic block diagram showing a muffling device in an exemplary arrangement of the present disclosure.

FIG. 2 is a schematic block diagram showing the structure of the muffling device 10 provided by the exemplary arrangement. Referring to FIG. 2, the muffling device 10 can include the followings.

An acquisition module 101 can be used to obtain reference sound wave information of the user. For example, the acquisition module can be composed of a pickup (e.g., a microphone) and a corresponding conversion circuit.

A modulation module 102 is connected to the acquisition module 101 and can be used to analyze the acoustic characteristics of the reference sound wave information to obtain characteristic parameters of the reference sound wave information. For example, the modulation module can be a corresponding circuit or a logic unit, and can extract characteristic parameters of sound wave information by perform sampling, spectrum analysis, etc. on the sound wave information.

A muffling module 103 is connected to the modulation module 102 and configured to generate compensation sound wave information according to the characteristic parameters of the reference sound wave information. The characteristic parameters of the compensated sound wave information are complementary to the characteristic parameters of the reference sound wave information, and the muffling module can be configured by a corresponding processor, logic circuit, integrated circuit, etc.

A calibration module 104 is connected to the acquisition module 101, the muffling module 103, and the output module 105, and can be used to compare the muffed sound wave information superimposed by the compensated sound wave information and the reference sound wave information with the reference sound wave information, and feed back the comparison result to the muffling module 103, so that the muffling module 103 adjusts the compensation acoustic wave information according to the feedback result. The correction module can be configured by a corresponding processor, a logic circuit, an integrated circuit or the like.

An output module 105, such as the speaker of the mobile phone, is connected to the acquisition module 101 and the muffling module 103, and can be used to output the adjusted compensated sound wave information.

In the arrangement, the complementary relationship between the compensated sound wave information and the reference sound wave information should at least include their phases being opposite, and in order to achieve a good muffling effect, the reference sound wave information and the compensated sound wave information of the opposite phase should be emitted from two mutually close positions. In order to directly superimpose without attenuation.

It should be noted that when the muffling device 10 is applied to a communication device, the acquisition module 101 can also be connected to the voice communication device 20 of the communication device (for example, a communication module of the mobile terminal), so as to transmit the voice content of the user to the other party's communication equipment. It can be seen that the muffling device 10 can effectively reduce the influence of the call volume on the surrounding environment while ensuring that both sides of the call are not affected.

In addition, the process of superimposing the compensated sound wave information and the reference sound wave information may be implemented by the muffling module. For example, after the muffling module generates the compensated sound wave information according to the characteristic parameters of the reference sound wave information, the compensated sound wave information and the reference sound wave information are superimposed to obtain the muffed sound wave information, and the sound wave information after the muffling is sent to the correction module; the process of compensating the sound wave information and the reference sound wave information may also be implemented by the correction module, for example, the muffling module sends the compensated sound wave information and the reference sound wave signal to the correction module, and then the correction module superimposes the two to obtain the muffled sound wave information, and then compares the muffled sound wave information with the reference sound wave information.

In addition, it should be noted that, in the foregoing arrangements, modules such as the modulation module, the muffling module, the correction module, and the like may be implemented by corresponding hardware circuits, but the disclosure is not limited thereto, and in other arrangements, corresponding computer readable instructions stored in the memory are executed on a general purpose processor to cause the processor to perform operations associated with the modules. Hereinafter, the corresponding modules/units can be configured in the same way, and will not be described again here.

The muffling device 10 provided by the exemplary arrangement of the present disclosure performs real-time modulation and muffling processing on the reference sound wave information of the user to generate compensated sound wave information complementary to the reference sound wave information, thus enabling reference sound wave information and the compensation sound wave information to be superimposed on each other to realize the muffling effect. On the basis of this, the accuracy of the muffling effect can be improved by further correcting and adjusting the compensated sound wave information in real time. In this way, the muffling device 10 can effectively reduce or even eliminate the user's call sound at the sound source, and on the other hand, can reduce the influence of the call volume on the surrounding environment, thus preventing others from being disturbed, and on the other hand, preventing the content of the call from being leaked, thus achieving a confidential call.

Based on this, the muffling device 10 provided by the exemplary arrangement is simple, safe, and reliable, and is not limited by the environment. For example, in a conference or lecture scene that is not suitable for telephone communication, the muffling device 10 can be directly used for telephone communication. There is no need to avoid the current environment or affect other participants. In addition, the muffling device 10 also has high mobility, and can be applied not only to communication devices but also various wearable devices such as necklaces or earphones to achieve good muffling and secrecy effects.

In the exemplary arrangement, the muffling principle of the muffling device 10 is based on superimposing two acoustic signals with opposite phases to achieve muffling, that is, the characteristic parameters of the compensated sound wave information are complementary to the characteristic parameters of the reference sound wave information. In the arrangement, the characteristic parameters of the sound wave information may include the phase, amplitude, frequency, and the like of the sound wave, and the complementary relationship may include having opposite phases, the same amplitude, the same frequency, and the like.

In this way, the compensated sound wave information and the reference sound wave information are a pair of sound wave information having opposite phases, the same amplitude, and the same frequency, and the two are superimposed on each other to obtain a good muffling effect.

It should be noted that although a good muffling effect can be achieved when the phase of the compensated sound wave information and the reference sound wave information are opposite, and the amplitude and the frequency are the same, the arrangement is not limited thereto, for example, the sound wave may be compensated when the compensated sound wave information and the reference sound wave information have opposite phase and similar amplitudes and frequencies, a certain muffling effect can be achieved.

In the example arrangement, the correction module 104 can be separated from the acquisition module 101 by a certain distance in order to obtain the muffled sound wave information and compare it with the reference sound wave information. Based on this, the correction module 104 can include the followings.

A monitoring unit is configured to compare the muffled sound wave information with the reference sound wave information and monitor in real time whether the amplitude of the muffled sound wave information exceeds a threshold amplitude, and send an alert notification to the correction unit when the threshold amplitude is exceeded.

The correction unit is connected to the monitoring unit, and is configured to feed back the comparison result to the muffling module 103 and send the correction instruction to the muffling module when receiving the warning notification that the amplitude of the muffed sound information sent by the monitoring unit exceeds the threshold amplitude, such that the 103 adjusts the compensated sound wave information in response to the correction command.

Specifically, the correction module 104 can compare the characteristic parameter of the sound wave information with the characteristic parameter of the reference sound wave information, and eliminate the interference (for example, the first muffling is the muffling process for the filtered sound, and the ambient sound is not considered, so the muffling signal only cancels the user's voice without canceling the ambient sound, thus there should still be noise in the obtained actual muffling effect) of the filtered sound wave information by comparing the difference between the phase, the frequency and the amplitude of the two, so as to get the actual noise reduction effect. On the basis of this, the correction module 104 may feed back the actual muffling effect to the muffling module 103 again, so that the muffling module 103 adjusts the compensated sound wave information according to the feedback result until the amplitude of the acoustic wave information after the muffling is less than the threshold amplitude, and the monitoring module continues to monitor during the termination of the adjustment.

Figure 3:
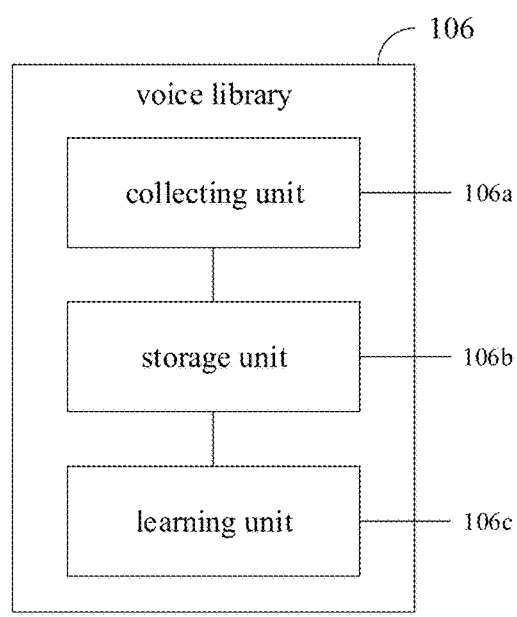
FIG. 3 is a schematic block diagram showing a voice library in an exemplary arrangement of the present disclosure.

In the exemplary arrangement, as shown in FIG. 3, the muffling device 10 may further include a voice library 106 in which standard acoustic wave information of the user is stored. Specifically, the voice library 106 may specifically include the followings.

A collecting unit 106a is configured to input at least one of the user's sound wave information and text information, and the sound wave information can be obtained through a way relating to voice information such as pre-recording and daily conversation, and the text information can be obtained through a way relating to text information such as text recording and text chat.

A storage unit 106b is configured to generate a user's voice library according to at least one of the recorded sound wave information and the text information, where the voice library may include a user's common sentences such as words, phrases, fixed sentences, and the like, and information such as the user's idioms and intonation.

A learning unit 106c is configured to optimize the user's voice library according to at least one of the recorded sound wave information and the text information, and specifically learn the user's language habits according to the existing information, for example, using a method of a cyclic neural network, and supplement the sensitive vocabulary according to the confidential information manually imported by the user, such as the industry secret content or the company confidential content, thus achieving the purpose of optimizing the voice library.

The voice library 106 can introduce relevant confidential information while continuously collecting the user's usage habits, so that the confidential content can be combined with the user's language habits. On one hand, it may facilitate more precise identification and filtering of the user's voice content, and on the other hand, it may predict the content of the call, thus ensuring that confidential content can be accurately and efficiently silenced during the call without being leaked, and achieving higher level of security.

In the exemplary arrangement, the acquisition module 101 can be configured to collect original sound wave information and filter the original sound wave information to obtain desired reference sound wave information, and transmit the reference sound wave information for communication, thus eliminating the interference of the noise in the environment and get a clear sound to improve the quality of the call. Based on this, referring to FIG. 2, the acquisition module 101 can include the followings.

An acquisition unit 101a, such as a microphone of a mobile phone, can be used to acquire raw sound wave information including the acoustic wave information of the user and the interference sound wave information of the environmental noise.

An identifying unit 101b is configured to identify the original sound wave information according to the standard sound wave information of the user stored in the voice library 106, to obtain in the original sound wave information the interference sound wave information having voiceprint feature different from the voiceprint feature of the standard sound wave information and the reference sound wave information having the same voiceprint feature with the standard sound wave information.

A filtering unit 101c can be configured to filter the original sound wave information and perform filtering by, for example, a filtering circuit to eliminate the interference sound wave information and retain the reference sound wave information.

In the arrangement, the standard sound wave information stored in the voice library 106 may include sound wave information pre-recorded by the user and sound wave information continuously recorded during use, and the sound wave information may be used as a comparison basis in subsequent use to identify the user's voiceprint feature.

It can be seen that the reference sound wave information of the user acquired by the acquisition module 101 can be the noise-filtered sound wave information, and the compensated sound wave information generated thus can perform effective muffling processing on the sound wave information related to the user's voice content. However, the present arrangement is not limited thereto. The reference sound wave information of the user acquired by the acquisition module 101 may also be sound wave information that is not noise-filtered, such as original sound wave information, and the compensated sound wave information generated accordingly may also have a certain muffling effect to the original sound wave information.

It should be noted that the user in this arrangement refers to the owner of the device in which the muffling device 10 is installed, such as the owner of the mobile phone, rather than any person who uses the mobile phone arbitrarily.

Figure 4:
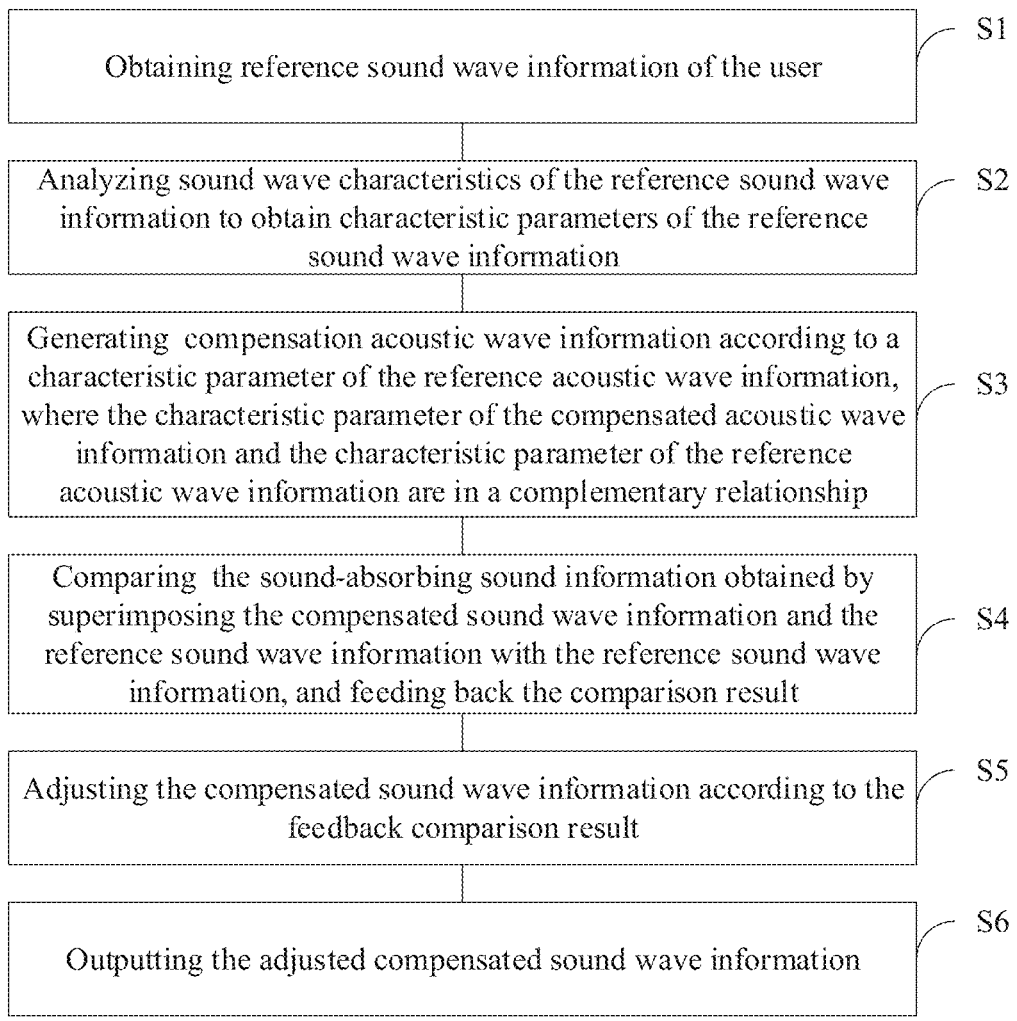
FIG. 4 is a flow chart showing a muffling method in an exemplary arrangement of the present disclosure.

The present example arrangement also provides a muffling method that can be used to reduce or even eliminate the volume of a call that spreads to the external environment. As shown in FIG. 4, the noise muffling method may include:

S1. obtaining reference sound wave information of the user;

S2. analyzing sound wave characteristics of the reference sound wave information to obtain characteristic parameters of the reference sound wave information;

S3. generating compensation acoustic wave information according to a characteristic parameter of the reference acoustic wave information, where the characteristic parameter of the compensated acoustic wave information and the characteristic parameter of the reference acoustic wave information are in a complementary relationship;

S4. comparing the sound-absorbing sound information obtained by superimposing the compensated sound wave information and the reference sound wave information with the reference sound wave information, and feeding back the comparison result;

S5. adjusting the compensated sound wave information according to the feedback comparison result; and S6. outputting the adjusted compensated sound wave information.

In the arrangement, the complementary relationship between the compensated sound wave information and the reference sound wave information may at least include having opposite phase, and in order to achieve a good muffling effect, the reference sound wave information and the compensated sound wave information of the opposite phase may be emitted from two mutually close positions, such that they are directly superimposed without attenuation.

The muffling method provided by the exemplary arrangement of the present disclosure performs real-time modulation and muffling processing on the reference sound wave information of the user to generate compensated sound wave information complementary to the reference sound wave information, and performs real-time correction and adjustment on the compensated sound wave information, so that the reference sound wave information and the compensated sound wave information are superimposed on each other to achieve a muffling effect. In this way, the muffling method can effectively reduce or even eliminate the user's call sound at the sound source, and on the other hand, can reduce the influence of the call volume on the surrounding environment, thus preventing others from being disturbed, and on the other hand, preventing the content of the call from being leaked, thus achieving a confidential call.

In the exemplary arrangement, the muffling principle of the muffling method is based on superimposing two acoustic signals with opposite phases to achieve muffling, that is, the characteristic parameters of the compensated sound wave information are complementary to the characteristic parameters of the reference sound wave information. In the arrangement, the characteristic parameters of the sound wave information may include the phase, amplitude, frequency, and the like of the sound wave, and the complementary relationship may include having opposite phases, the same amplitude, the same frequency, and the like.

In this way, the compensated sound wave information and the reference sound wave information are a pair of sound wave information having opposite phases, the same amplitude, and the same frequency, and the two are superimposed on each other to obtain a good muffling effect.

In the arrangement, S1 may include:

S101. acquiring original sound wave information including sound wave information of the user;

S102. identifying the original sound wave information according to a standard sound wave information of the user stored in the voice library to obtain interference sound wave information in the original sound wave information that is different from a voiceprint feature of the standard sound wave information, and the reference sound wave information that is the same as the voiceprint feature of the standard sound wave information; and S103. filtering the original sound wave information to eliminate the interference sound wave information and retain the reference sound wave information.

In the arrangement, the standard sound wave information stored in the voice library 106 may include sound wave information pre-recorded by the user and sound wave information continuously recorded during use, and the sound wave information may be used as a comparison basis in subsequent use to identify the user's voiceprint feature.

In this way, by filtering the original sound wave information to obtain the desired reference sound wave information, the noise interference in the environment can be eliminated to obtain a clear sound, thus achieving the effect of improving the call quality.

On the above basis, the method for generating and optimizing the voice library 106 may include:

S01. inputting at least one of the user's sound wave information and text information, and the sound wave information can be obtained through a way relating to voice information such as pre-recording and daily conversation, and the text information can be obtained through a way relating to text information such as text recording and text chat.

S02. generating a user's voice library according to at least one of the recorded sound wave information and the text information, where the voice library may include a user's common sentences such as words, phrases, fixed sentences, and the like, and information such as the user's idioms and intonation.

S03. optimizing the user's voice library according to at least one of the recorded sound wave information and the text information, and specifically learning the user's language habits according to the existing information, for example, using a method of a cyclic neural network, and supplementing the sensitive vocabulary according to the confidential information manually imported by the user, such as the industry secret content or the company confidential content, thus achieving the purpose of optimizing the voice library.

In the arrangement, the sound wave information and the text information may include the user's idioms and the confidential information imported by the user.

In this way, the voice library 106 can introduce relevant confidential information while continuously collecting the user's usage habits, so that the confidential content can be combined with the user's language habits. On one hand, it may facilitate more precise identification and filtering of the user's voice content, and on the other hand, it may predict the content of the call, thus ensuring that confidential content can be accurately and efficiently silenced during the call without being leaked, and achieving higher level of security.

In the arrangement, S4 may include:

S401. comparing the muffled sound wave information and the reference sound wave information, and monitoring in real-time whether the amplitude of the muffled sound wave information exceeds the threshold amplitude; and S402. feeding back the comparison result and sending a correction command in the case where the amplitude of the muffled sound wave information exceeds the threshold amplitude.

On the above basis, S5 can adjust the compensated sound wave information according to the feedback result until the amplitude of the muffled sound wave information is less than the threshold amplitude, and continuously keep monitoring during the termination of the adjustment.

It should be noted that the relevant details of the muffling method have been described in detail in the corresponding muffling device 10, and therefore will not be described repeatedly herein.

On the basis of the above-described muffling device 10, the present exemplary arrangement provides a communication device such as a mobile phone, which may include the above muffling device 10 and a voice communication device 20, and the voice communication device 20 may be connected to the consumer. The acquisition module 101 of the sound device 10 can be integrated into the mobile phone to transmit the voice content of the user to the communication device of the other party, thus reducing the impact of the volume of the call to the surrounding environment while ensuring that both sides of the call are not affected and realizing confidential calls.

On the basis of the above-described muffling device 10, another aspect of the present exemplary arrangement provides a wearable device such as an earphone or a necklace, which may include the above-described muffling device 10, for example, the muffling device 10 is embedded in the wearable device, thus reducing the impact of the volume of the call to the surrounding environment while ensuring that both sides of the call are not affected and realizing confidential calls.

It should be noted that the muffling device 10 can be used as a separate module when the device is applied to the communication device or the wearable device, and the components can be applied in a separate and communicable manner, which is not specifically limited in this arrangement.

Figure 5:
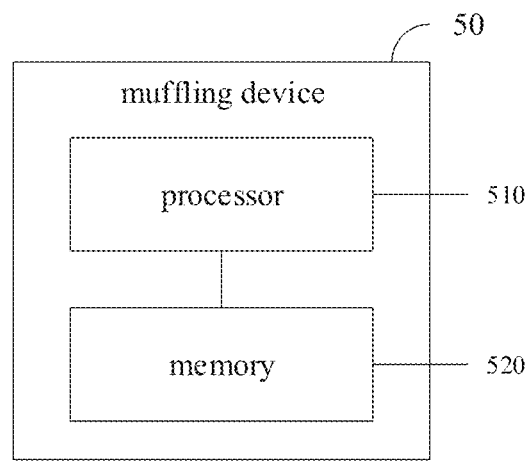
FIG. 5 is a schematic block diagram showing a muffling device in an exemplary arrangement of the present disclosure.

According to an arrangement of the present disclosure, as shown in FIG. 5, a muffling device 50 includes: a processor 510; and a memory 520 storing computer readable instructions that, when executed, causes the processor 510 to perform a muffling method in accordance with the present disclosure. Various details of the muffling method according to the present disclosure have been described in detail with reference to the foregoing arrangements, and will not be described again herein.

The device and method for muffling, communication device and wearable device provided by the exemplary arrangement of the present disclosure performs real-time modulation and muffling processing on the reference sound wave information of the user to generate compensated sound wave information complementary to the reference sound wave information, thus enabling reference sound wave information and the compensation sound wave information to be superimposed on each other to realize the muffling effect. On the basis of this, the accuracy of the muffling effect can be improved by further correcting and adjusting the compensated sound wave information in real time. In this way, the muffling device can effectively reduce or even eliminate the user's call sound at the sound source, and on the other hand, can reduce the influence of the call volume on the surrounding environment, thus preventing others from being disturbed, and on the other hand, preventing the content of the call from being leaked, thus achieving a confidential call.

It should be noted that although several modules or units of the equipment for action execution are mentioned in the detailed description above, such division is not mandatory. In fact, features and functions of two or more of the modules or units described above may be embodied in one module or unit in accordance with the arrangements of the present disclosure. Conversely, the features and functions of one module or unit described above may be further divided into multiple modules or units.

In addition, although the various blocks of the method of the present disclosure are described in a particular order in the figures, this is not required or implied that the blocks must be performed in the specific order, or all the blocks shown must be performed to achieve the desired result. Additionally or alternatively, certain blocks may be omitted, multiple blocks may be combined into one block execution, and/or one block may be decomposed into multiple blocks and the like.

Other arrangements of the present disclosure will be apparent to those skilled in the art after considering the specification and implementing the technical solutions disclosed herein. The present application is intended to cover any variations, uses, or adaptations of the present disclosure, which are in accordance with the general principles of the present disclosure and include common general knowledge or conventional technical means in the art that are not disclosed in the present disclosure. The specification and arrangements are to be regarded as illustrative only, and the real scope and principle of the present disclosure are indicated by the claims.

It is to be understood that the present disclosure is not limited to the particular structures described above and illustrated in the drawings, and modifications and changes are available without departing from the scope of the present disclosure. The scope of the disclosure is to be limited only by the appended claims.

What is claimed is:

1. A muffling device comprising:
   an acquisition circuit, configured to obtain reference sound wave information of a user;
   a modulation circuit, configured to analyze an acoustic wave characteristic of the reference sound wave information to obtain a characteristic parameter of the reference sound wave information;
   a muffling circuit, configured to generate compensated sound wave information according to the characteristic parameter of the reference sound wave information, wherein a characteristic parameter of the compensated sound wave information and the characteristic parameter of the reference sound wave information are complementary to each other;
   a correction circuit, configured to compare muffed sound wave information superimposed by the compensated sound wave information and the reference sound wave information with the reference sound wave information, and feed back a comparison result to the muffling circuit, wherein the muffling circuit is further configured to adjust the compensated sound wave information according to the fed back comparison result; and
   an output circuit, configured to output adjusted compensated sound wave information.

2. The muffling device according to claim 1, wherein the characteristic parameters comprises a phase, an amplitude, and a frequency, and the complementary comprises opposite phases, same amplitude, and same frequency.

3. The muffling device according to claim 1, wherein the correction circuit comprises:
   a monitoring circuit, configured to compare the muffed sound wave information with the reference sound wave information and monitor in real time whether an amplitude of the muffed sound wave information exceeds a threshold amplitude; and
   a correcting circuit, configured to feed back the comparison result to the muffling circuit and transmit a correction command when the amplitude of the muffed sound wave information exceeds the threshold amplitude.

4. The muffling device according to claim 1, further comprising a voice library, wherein the voice library comprises:
   a collecting circuit, configured to input at least one of sound wave information and text information of the user;
   a storage circuit, configured to generate a user's voice library according to at least one of recorded sound wave information and text information; and
   a learning circuit, configured to optimize the user's voice library according to at least one of the recorded sound wave information and the text information.

5. The muffling device according to claim 1, wherein the acquisition circuit comprises:
   an acquisition circuit, configured to acquire original sound wave information including sound wave information of the user;
   an identification circuit, configured to identify the original sound wave information according to a standard sound wave information of the user stored in a voice library to obtain interference sound wave information in the original sound wave information that is different from a voiceprint feature of the standard sound wave information, and the reference sound wave information that is the same as the voiceprint feature of the standard sound wave information; and
   a filtering circuit, configured to filter the original sound wave information to eliminate the interference sound wave information and retain the reference sound wave information.

6. A communication device comprising the muffling device according to claim 1 and a voice communication device, wherein the voice communication device is connected to the acquisition circuit of the muffling device.

7. A wearable device comprising the muffling device according to claim 1.

8. A muffling method comprising:
   obtaining reference sound wave information of a user;
   analyzing an acoustic wave characteristic of the reference sound wave information to obtain a characteristic parameter of the reference sound wave information;
   generating compensated sound wave information according to the characteristic parameter of the reference sound wave information, wherein a characteristic parameter of the compensated sound wave information and the characteristic parameter of the reference sound wave information are complementary to each other;
   comparing muffed sound wave information superimposed by the compensated sound wave information and the reference sound wave information with the reference sound wave information, and feeding back a comparison result;
   adjusting the compensated sound wave information according to the fed back comparison result; and
   outputting adjusted compensated sound wave information.

9. The muffling method according to claim 8, wherein the characteristic parameters comprises a phase, an amplitude, and a frequency.

10. The muffling method according to claim 8, wherein comparing muffed sound wave information superimposed by the compensated sound wave information and the reference sound wave information with the reference sound wave information, and feeding back a comparison result comprises:

comparing the muffed sound wave information with the reference sound wave information and monitor in real time whether an amplitude of the muffed sound wave information exceeds a threshold amplitude; and feeding back the comparison result and transmitting a correction command when the amplitude of the muffed sound wave information exceeds the threshold amplitude.

11. The muffling method according to claim 8, further comprising:

inputting at least one of sound wave information and text information of the user;

generating a user's voice library according to at least one of recorded sound wave information and text information;

optimizing the user's voice library according to at least one of the recorded sound wave information and the text information, and wherein the sound wave information and the text information comprise the idiom of the user and confidential information imported by the user.

12. The muffling method according to claim 8, wherein obtaining reference sound wave information of a user comprises:

acquiring original sound wave information including sound wave information of the user;

identifying the original sound wave information according to a standard sound wave information of the user stored in the user's voice library to obtain interference sound wave information in the original sound wave information that is different from a voiceprint feature of the standard sound wave information, and the reference sound wave information that is the same as the voiceprint feature of the standard sound wave information; and filtering the original sound wave information to eliminate the interference sound wave information and retain the reference sound wave information.

13. A muffling device comprising:

a processor; and a non-transitory memory stored with computer readable instructions that, when executed, cause the processor to be configured to perform the muffling method according to claim 8.

14. The muffling device according to claim 13, wherein the characteristic parameters comprises a phase, an amplitude, and a frequency.

15. The muffling device according to claim 13, wherein the comparing muffed sound wave information superimposed by the compensated sound wave information and the reference sound wave information with the reference sound wave information, and feeding back a comparison result comprises:

comparing the muffed sound wave information with the reference sound wave information and monitor in real time whether an amplitude of the muffed sound wave information exceeds a threshold amplitude; and feeding back a comparison result and transmitting a correction command when the amplitude of the muffed sound wave information exceeds the threshold amplitude.

16. The muffling device according to claim 13, further comprising:

inputting at least one of sound wave information and text information of the user;

generating a user's voice library according to at least one of recorded sound wave information and text information;

optimizing the user's voice library according to at least one of the recorded sound wave information and the text information, and wherein the sound wave information and the text information comprise the idiom of the user and the confidential information imported by the user.

17. The muffling device according to claim 13, wherein the obtaining reference sound wave information of a user comprises:

acquiring original sound wave information including sound wave information of the user;

identifying the original sound wave information according to a standard sound wave information of the user stored in the voice library to obtain interference sound wave information in the original sound wave information that is different from a voiceprint feature of the standard sound wave information, and the reference sound wave information that is the same as the voiceprint feature of the standard sound wave information; and filtering the original sound wave information to eliminate the interference sound wave information and retain the reference sound wave information.

\* \* \* \* \*